United States Patent
Kawasaki et al.

(10) Patent No.: US 10,700,006 B2
(45) Date of Patent: Jun. 30, 2020

(54) MANUFACTURING METHOD OF NICKEL WIRING

(71) Applicant: TOKYO ELECTRON LIMITED, Tokyo (JP)

(72) Inventors: Hiroaki Kawasaki, Yamanashi (JP); Takashi Matsumoto, Yamanashi (JP); Hiroyuki Nagai, Yamanashi (JP); Ryota Ifuku, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/714,951

(22) Filed: Sep. 25, 2017

(65) Prior Publication Data
US 2018/0090446 A1  Mar. 29, 2018

(30) Foreign Application Priority Data
Sep. 27, 2016 (JP) .................................. 2016-188146

(51) Int. Cl.
*H01L 23/532* (2006.01)
*H01L 21/285* (2006.01)
(Continued)

(52) U.S. Cl.
CPC ...... *H01L 23/53209* (2013.01); *C23C 16/045* (2013.01); *C23C 16/18* (2013.01); *C23C 16/56* (2013.01); *H01L 21/28556* (2013.01); *H01L 21/28562* (2013.01); *H01L 21/28568* (2013.01); *H01L 21/321* (2013.01); *H01L 21/3212* (2013.01); *H01L 21/32115* (2013.01); *H01L 21/7684* (2013.01); *H01L 21/76814* (2013.01); *H01L 21/76843* (2013.01); *H01L 21/76879* (2013.01); *H01L 21/76882* (2013.01)

(58) Field of Classification Search
CPC ......... H01L 23/53209; H01L 21/28568; H01L 21/76843; H01L 21/76882; H01L 21/7684; H01L 21/28562; H01L 21/76879; H01L 21/3212; H01L 21/76813; H01L 21/76804; H01L 21/76814; H01L 21/28556; H01L 23/53242; C23C 16/18
See application file for complete search history.

(56) References Cited

U.S. PATENT DOCUMENTS 8,669,191 B2 * 3/2014 Uehigashi ......... H01L 21/28518
257/E21.24
9,624,576 B2 * 4/2017 Chen ...................... C23C 14/48
(Continued)

FOREIGN PATENT DOCUMENTS

JP 2007-507892 3/2007
JP 2013-187350 9/2013
(Continued)

*Primary Examiner* — Latanya N Crawford
(74) *Attorney, Agent, or Firm* — Fenwick & West LLP

(57) ABSTRACT

There is provided a method for manufacturing Ni wiring. The method includes forming an Ni film on a surface of a substrate having a recess formed thereon by CVD or ALD by using an Ni compound as a film forming material and $NH_3$ gas and $H_2$ gas as reduction gases to partially fill the recess. The method further includes annealing the substrate to make the Ni film on the surface of the substrate and on a side surface of the recess reflow into the recess.

15 Claims, 15 Drawing Sheets

(51) Int. Cl.
*H01L 21/768* (2006.01)
*H01L 21/321* (2006.01)
*C23C 16/56* (2006.01)
*C23C 16/04* (2006.01)
*C23C 16/18* (2006.01)

(56) References Cited

U.S. PATENT DOCUMENTS

| | | | |
|---|---|---|---|
| 9,754,883 B1* | 9/2017 | Briggs | H01L 21/7685 |
| 2005/0069632 A1 | 3/2005 | Yamamsaki et al. | |
| 2010/0301486 A1* | 12/2010 | Frohberg | H01L 21/0337 |
| | | | 257/770 |
| 2013/0059079 A1* | 3/2013 | Yuasa | C23C 16/18 |
| | | | 427/255.28 |
| 2014/0374904 A1* | 12/2014 | Matsumoto | H01L 23/5226 |
| | | | 257/741 |
| 2017/0200642 A1* | 7/2017 | Shaviv | H01L 21/76843 |

FOREIGN PATENT DOCUMENTS

| | | |
|---|---|---|
| JP | 2013-209701 | 10/2013 |
| JP | 2014-062281 | 4/2014 |
| JP | 2015-101752 | 6/2015 |
| KR | 2008-0062563 A | 7/2008 |
| KR | 2012-0116883 A | 10/2012 |
| KR | 2013-0121041 A | 11/2013 |

\* cited by examiner

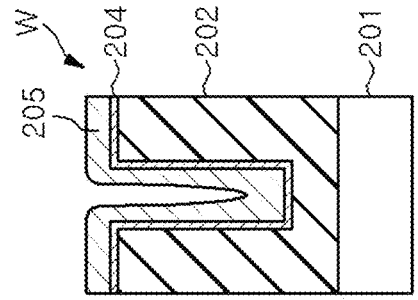
*FIG.2A*
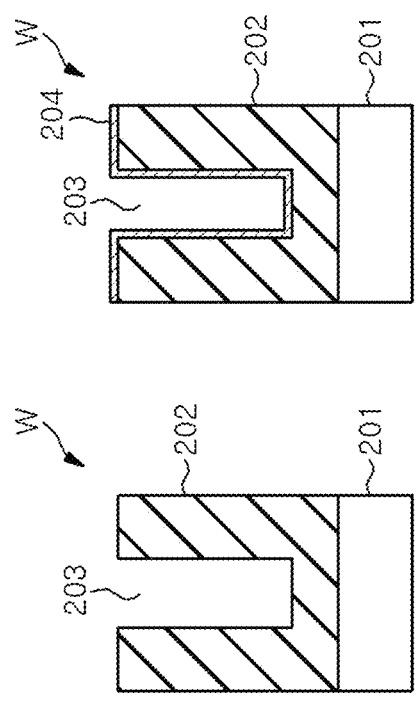
*FIG.2B*
*FIG.2C*
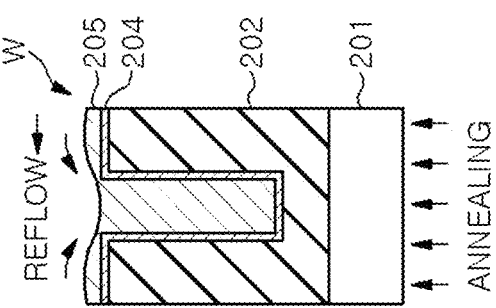
*FIG.2D*
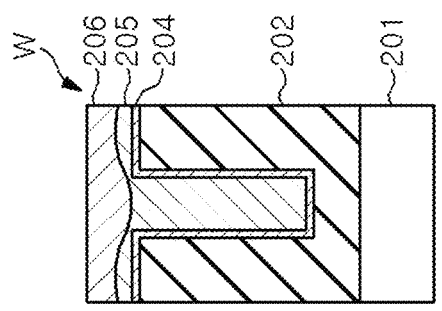
*FIG.2E*
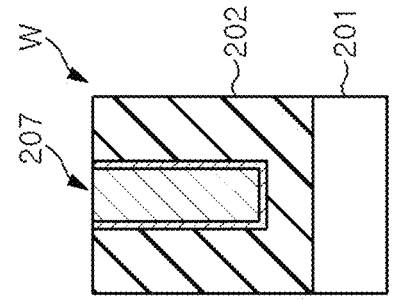
*FIG.2F*

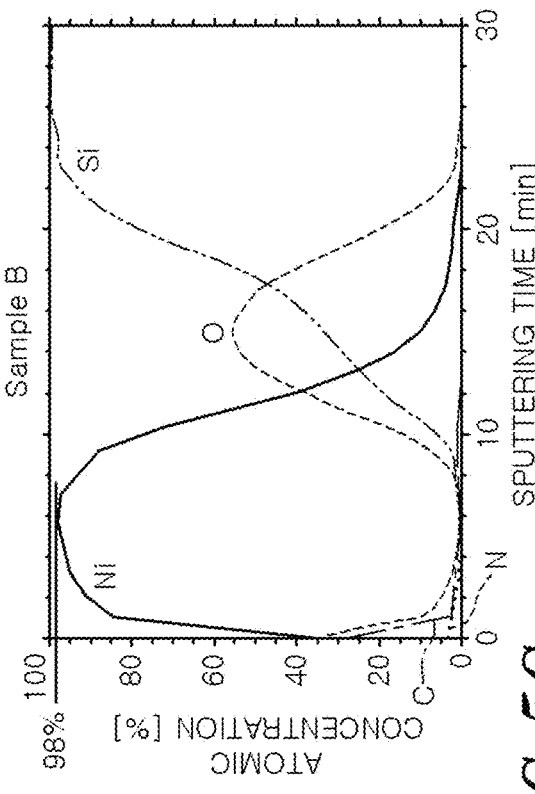
FIG. 5A Sample A
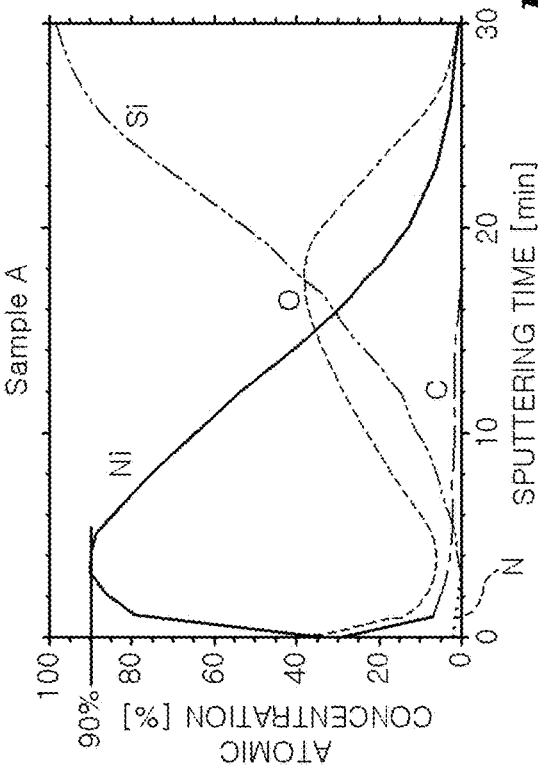
FIG. 5B Sample B
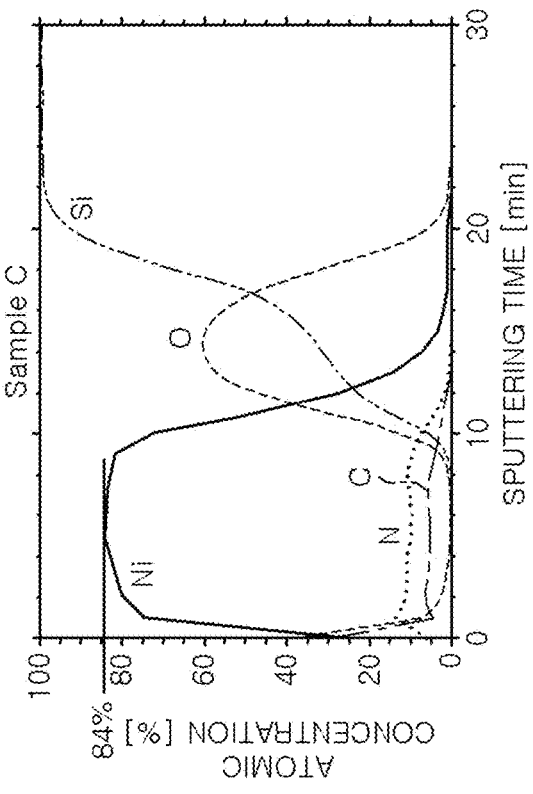
FIG. 5C Sample C

FIRST FORMATION AND ANNEALING

SECOND FORMATION AND ANNEALING

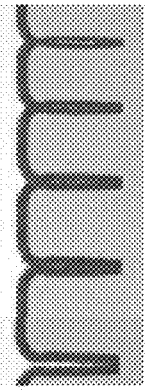
FIG. 12A  as depo
FIG. 12B  FORMATION + ANNEALING

FIG. 14
| | CONDITION 1 | CONDITION 2 | CONDITION 3 | CONDITION 4 |
|---|---|---|---|---|
| | as depo(NO ANNEALING) $NH_3/H_2$=50%/50% Ni30nm | FORMATION+ANNEALING $NH_3/H_2$=50%/50% Ni30nm | (FORMATION+ ANNEALING)×2 $NH_3/H_2$=50%/50% Ni20nm | as depo(NO ANNEALING) $NH_3/H_2$=100%/0% Ni30nm |
| | 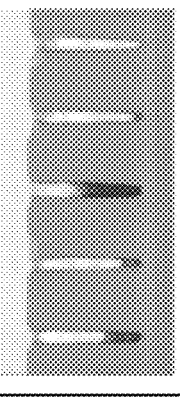 | 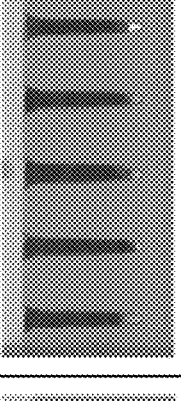 | 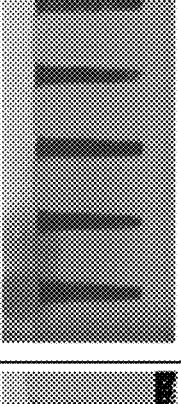 | 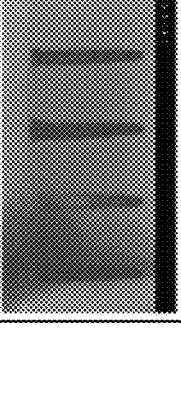 |
| CD (MIDDLE CD) | 29nm | 32nm | 30nm | 27nm |
| RESISTIVITY | 45.8μΩ·cm | 23.6μΩ·cm | 21.1μΩ·cm | OPEN |

MANUFACTURING METHOD OF NICKEL WIRING

CROSS-REFERENCE TO RELATED APPLICATIONS

This application claims priority to Japanese Patent Application No. 2016-188146 filed on Sep. 27, 2016, the entire contents of which are incorporated herein by reference.

FIELD OF THE INVENTION

The present disclosure relates to a manufacturing method of nickel wiring.

BACKGROUND OF THE INVENTION

Recently, along with a trend toward miniaturization of semiconductor devices, miniaturization of wiring advances. Therefore, copper (Cu) having a low bulk resistance is used as a wiring material.

As the miniaturization further advances, an increase in a wiring resistance due to a size effect becomes a problem. In other words, when a wiring width is smaller than a mean free path of an electron in wiring, scattering occurs by collision of the electron with a grain boundary or a side surface of the wiring. As a consequence, the wiring resistance is considerably increased. The mean free path of the electron depends on a wiring material. In the case of Cu, the mean free path of the electron is about 40 nm, which is large. Therefore, it is difficult in recent fine wiring having a line width of 32 nm to obtain a sufficient wiring resistance by using Cu.

Accordingly, as for a next-generation wiring material, there may be used a material having a bulk resistance that is not as low as that of Cu but whose electron has a mean free path shorter than that of Cu.

Such a material may be nickel (Ni). A bulk resistance (resistivity) of Ni is about 7 $\mu\Omega$-cm which is higher than 1.7 $\mu\Omega$-cm of Cu. The mean free path of the electron of Ni is about 8 nm which is considerably shorter than that of Cu.

A technique using a Ni film for fine wiring is disclosed in Japanese Patent Application Publication No. 2013-187350. Japanese Patent Application Publication No. 2013-187350 discloses a semiconductor device having wiring mainly made of Ni or Co and a line width and/or a height of the wiring of 15 nm or less. As for a film forming method for forming wiring, there are disclosed chemical vapor deposition (CVD), physical vapor deposition (PVD) and atomic layer deposition (ALD).

Other methods for forming a Ni film are disclosed in Japanese Patent Application Publication Nos. 2013-209701, 2007-507892, 2014-62281 and 2015-10175.

Japanese Patent Application Publication No. 2013-209701 discloses a method for forming a Ni film by CVD by using nickel amidinate as a film forming material gas and $NH_3$ gas and $H_2$ gas as reduction gases.

Japanese Patent Application Publication No. 2007-507892 discloses a metal layer forming method including exposing a substrate to a pulse of a metal-carbonyl precursor gas and exposing the substrate to a reduction gas. In this method, Ni is used as an example of the metal layer, and $H_2$ and $NH_3$ are used as reduction gases.

Japanese Patent Application Publication No. 2014-62281 discloses a method for forming a high-purity Ni film by performing an initial film forming process using CVD on a semiconductor wafer by using nickel amidinate as a film forming material gas and ammonia as a reduction gas, performing hydrogen treatment on the wafer by using $H_2$ gas to remove impurities, and performing a main film forming process using CVD by using nickel amidinate as a film forming material gas and $H_2$ gas as a reduction gas.

Japanese Patent Application Publication No. 2015-10175 discloses a method for forming a high-purity Ni film at a high film forming rate by performing an ammonia atmosphere forming process of forming an ammonia atmosphere after the initial film forming process and the hydrogen treatment disclosed in Japanese Patent Application Publication No. 2014-62281 and then performing a main film forming process using nickel amidinate and $H_2$ gas.

Japanese Patent Application Publication No. 2013-187350 discloses that Ni is used for the fine wiring. However, a beta film formed in a test example is evaluated and actual formation of wiring is not disclosed.

In Japanese Patent Application Publication No. 2007-507892, the Ni film is used as a barrier/liner of a Cu film in the case of forming Cu wiring. In Japanese Patent Application Publication Nos. 2013-209701, 2014-62281 and 2015-10175, the Ni film is used for forming silicide of a gate electrode or a contact portion of source/drain of an MOS type semiconductor. The Ni wiring is not necessarily formed by burying a Ni film in a fine recess.

SUMMARY OF THE INVENTION

In view of the above, the present disclosure provides a technique capable of forming fine Ni wiring by burying a nickel film in a fine recess.

In accordance with an aspect of the present disclosure, there is provided a method for manufacturing Ni wiring, the method including: forming a Ni film on a surface of a substrate having a recess formed thereon by CVD or ALD by using a Ni compound as a film forming material and $NH_3$ gas and $H_2$ gas as reduction gases to partially fill the recess; and annealing the substrate to make the Ni film on the surface of the substrate and on a side surface of the recess reflow into the recess.

In accordance with another aspect of the present disclosure, there is provided a non-transitory computer-readable storage medium storing a program for controlling a Ni wiring manufacturing system. The program, when executed by a processor, performs the Ni wiring manufacturing method described above by controlling the Ni wiring manufacturing system

BRIEF DESCRIPTION OF THE DRAWINGS

The objects and features of the disclosure will become apparent from the following description of embodiments, given in conjunction with the accompanying drawings, in which:

FIGS. 2A to 2F are process cross sectional views schematically showing the Ni wiring manufacturing method according to the embodiment;

FIGS. 5A to 5C show element analysis results in a depth direction of a film which are obtained by XPS in the case of forming a Ni film by CVD by using nickel alkyl amidinate and varying a ratio of $NH_3/H_2$ of reduction gases;

FIGS. 12A and 12B show TEM images of cross sections in an as-deposited state and after Ni film formation under different conditions and annealing in a test example 1;

FIG. 14 shows TEM images of cross sections of Ni wiring formed under conditions 1 to 4, actual CD values and resistivities in a test example 3;

DETAILED DESCRIPTION OF THE EMBODIMENTS

Hereinafter, embodiments will be described in detail with reference to the accompanying drawings.

<Outline of Ni Wiring Forming Method>

Figure 1:
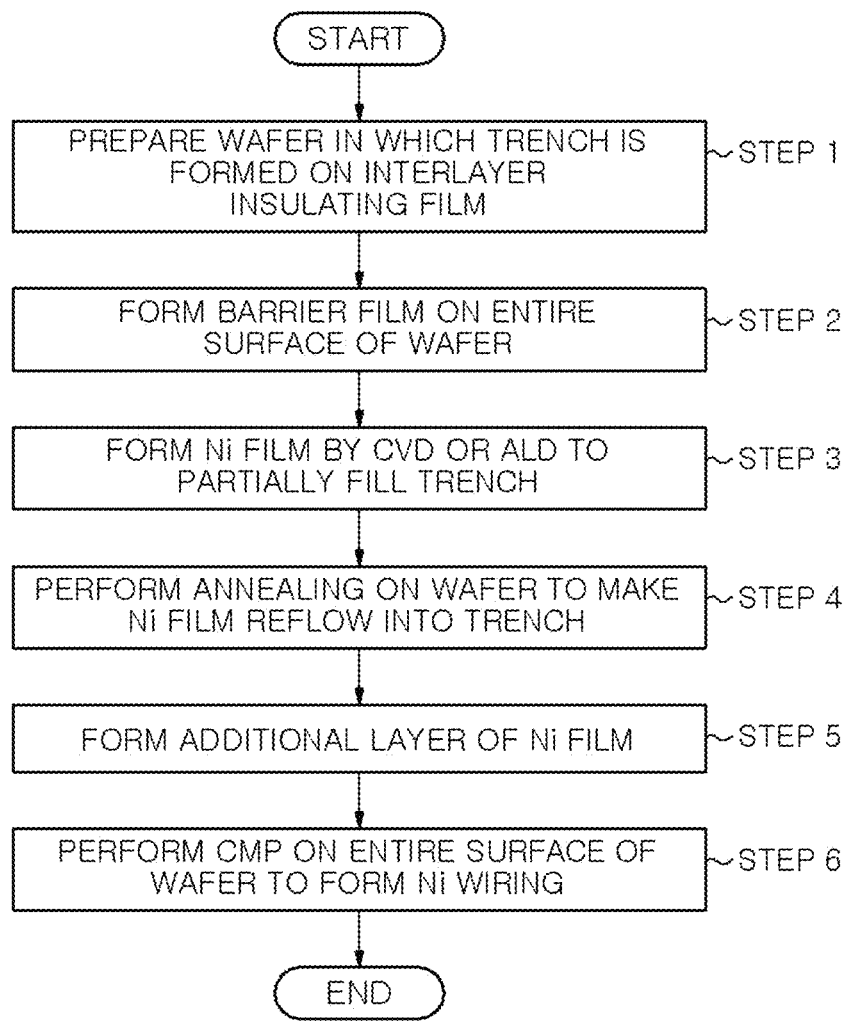
FIG. 1 is a flowchart schematically showing a Ni wiring manufacturing method according to an embodiment.

Hereinafter, an outline of a Ni wiring manufacturing method according to an embodiment will be described. FIG. 1 is a flowchart schematically showing the Ni wiring manufacturing method according to the embodiment. FIGS. 2A to 2F are cross sectional views showing process of the Ni wiring manufacturing method.

First, there is prepared a semiconductor wafer (hereinafter, simply referred to as "wafer") as a target substrate in which a base 201 is made of a semiconductor such as silicon or the like and has a predetermined underlying structure (not shown); an interlayer insulating film (underlying film) 202, e.g., an $SiO_2$ film, a low dielectric (Low-k) film (SiCO, SiCOH or the like) or the like, is formed on the base 201; and a trench (recess) 203 is formed in a predetermined pattern on the interlayer insulating film (underlying film) 202 (step 1, FIG. 2A).

Next, the wafer W is subjected to a degas process or a pre-clean process as pre-treatment, if necessary. Then, a barrier film 204 for suppressing diffusion of Ni is formed on an entire surface including a surface of the trench 203 (step 2, FIG. 2B).

As for the barrier film 204, it is preferable to use a film having a low resistance and a high barrier property with respect to Ni. A Ti film, a TiN film, a Ta film, a TaN film or the like may be appropriately used. The barrier film 204 may be formed by physical vapor deposition (PVD) or by chemical vapor deposition (CVD). It is difficult for Ni to diffuse than Cu which is a conventional wiring material. Therefore, the barrier film 204 may be thinner than that of the Cu wiring and may have a thickness of about 1 nm. Depending on conditions, the Ni film may be filled without forming the barrier film.

Next, a Ni film 205 is formed on an entire surface of the wafer having the barrier film 204 thereon, by CVD or atomic layer deposition (ALD) using a film forming material gas and a reduction gas and, thus, the trench 203 is partially filled with the Ni film (step 3, FIG. 2C).

Then, an annealing process is performed on the wafer W to make the Ni film 205 on a sidewall of the trench 203 and on the surface of the wafer W reflow into the trench 203 (step 4, FIG. 2D).

Thereafter, if necessary, an additional layer 206 of the Ni film is formed to prepare a next polishing process (step 5, FIG. 2E). The additional layer 206 may be formed by PVD or CVD.

Next, an entire surface of the wafer W is polished by chemical mechanical polishing (CMP), and the additional layer 206, the Ni film 205 and the barrier film 204 in a field portion other than the trench 203 are removed for planarization (step 6, FIG. 2F). Accordingly, fine Ni wiring 207 can be formed.

Alternatively, a via hole may be formed at a predetermined interval between a bottom portion of the trench 203 and the underlying structure on the base 201. The trench 203 and the via hole may be filled at the same time.

Next, the steps 3 and 4 that are main steps among the above-described steps will be described in detail.

In the film formation of the step 3, CVD or ALD is used as a film forming technique to form a Ni film in a fine trench while ensuring a high step coverage. Since PVD tends to provide poor step coverage, it is difficult to fill a fine trench with PVD method. However, the film can be formed in the fine trench by using CVD or ALD.

In the case of forming a Ni film by CVD, a Ni compound gas as a film forming material gas and a reduction gas are supplied to the wafer W at the same time. In the case of forming a Ni film by ALD, the supply of the film forming material gas and the supply of the reduction gas are alternately performed with a process of removing a residual gas on the wafer W interposed therebetween.

As for the Ni compound used as the film forming material, it is possible to use nickel amidinate, e.g., nickel alkyl amidinate. Nickel alkyl amidinate may be used while being dissolved in an appropriate solvent (e.g., tetralin solvent). Examples of nickel alkyl amidinate include nickel(II) N, N'-ditertiarybutylamidinate, nickel(II) N, N'-diisopropylamidinate, nickel(II) N, N'-diethylamidinate, nickel(II) N, N'-dimethylamidinate or the like. As an examples of another Ni compound, it is possible to use bis(cyclopentadienyl) nickel, bismethylcyclopentadienyl nickel, bis(ethylcyclopentadienyl) nickel, bis(isopropylcyclopentadienyl) nickel, bis(2, 2, 6, 6-tetra methyl-3, 5-heptanedionato) nickel(II), bis(hexafluoroacetylacetonato) nickel(II), tetrakis(trifluorophosphine) nickel or the like. Among these Ni compounds, it is preferable to use nickel amidinate. By using nickel amidinate, the Ni film can be formed in the fine trench while ensuring high step coverage. Nickel amidinate has an extremely high adsorption property when $NH_3$ gas exists on the surface of the wafer W.

As for the reduction gas, $NH_3$ gas and $H_2$ gas may be appropriately used. It is preferable to use both of $NH_3$ gas and $H_2$ gas. In that case, film formation morphology (particle diameter) and the resistivity are changed by changing a ratio of $NH_3$ gas to $H_2$ gas. Specifically, when the amount of $NH_3$ gas is increased, the morphology is improved (that is, the particle diameter is decreased). However, the amount of impurities containing N is also increased, which leads to the increase in resistivity of the film. On the other hand, when the amount of $NH_3$ gas is decreased (that is, when the amount of $H_2$ gas is increased), the amount of impurities is decreased and the resistivity is decreased. However, the morphology becomes poor. In some cases, the poor morphology results in the increase of the resistivity. In the Ni film that fills the fine trench 203, the morphology needs to be within a tolerable range at a low resistivity. By appropriately controlling the ratio of $NH_3$ gas to $H_2$ gas, it is possible to obtain a Ni film that satisfies the above requirement.

From the above, a tolerable ratio of $NH_3$ gas to $H_2$ gas ($NH_3/H_2$ ratio), which is a flow rate ratio (volume ratio), is within a range from 0.25 to 4 (20%/80% to 80%/20%). In that range, a comparatively low resistivity can be obtained and the morphology can be within a tolerable range depending on a trench width. The $NH_3/H_2$ ratio is preferably within a range from 0.67 to 4 (40%/60% to 80%/20%). In that range, both of the low resistivity and the morphology in the tolerable range can be realized. The $NH_3/H_2$ ratio is more preferably within a range of 0.67 to 2.33 (40%/60% to 70%/30%).

Figure 3:
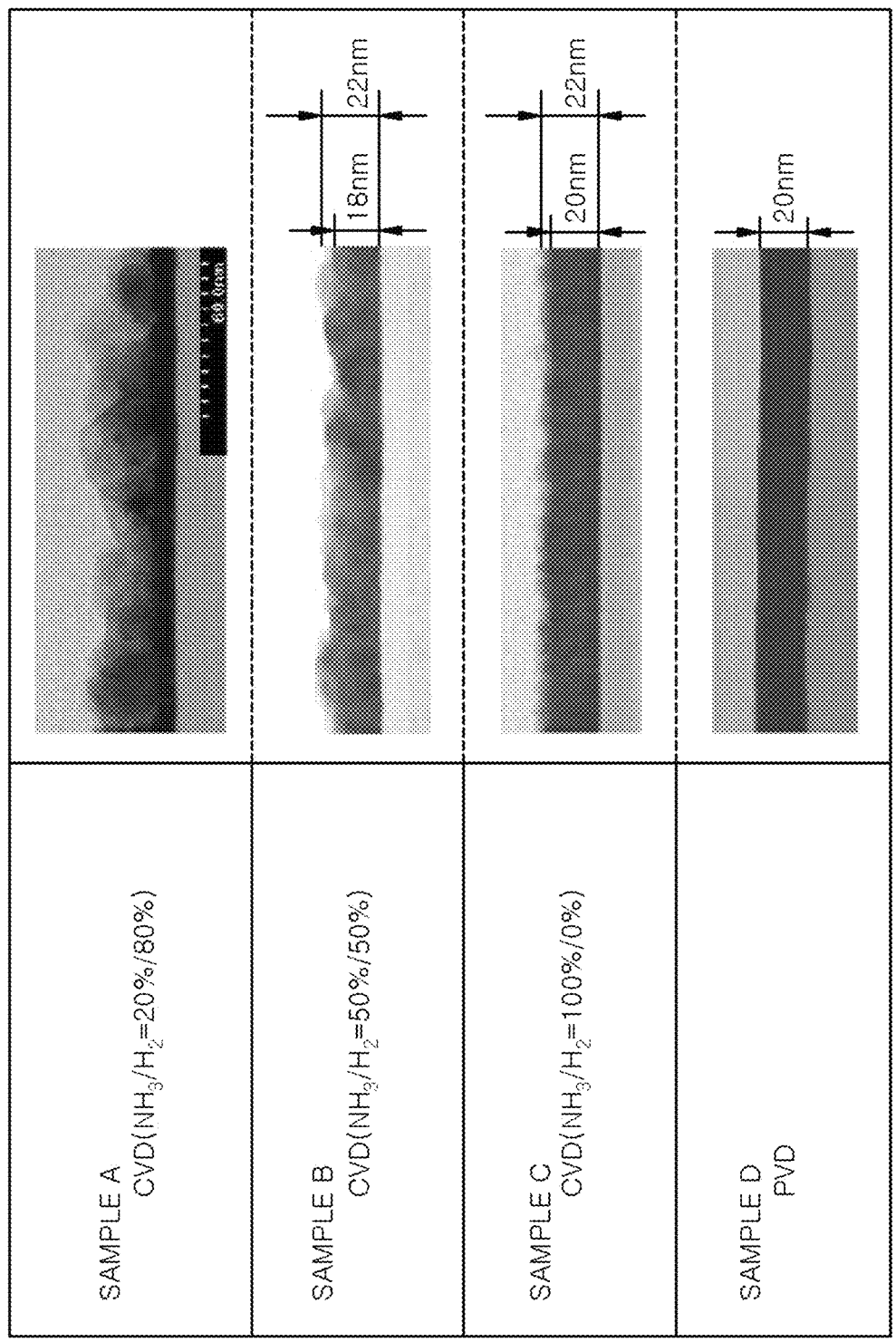
FIG. 3 shows TEM images in the case of forming a Ni film by CVD by using nickel alkyl amidinate and varying a ratio of $NH_3/H_2$ of reduction gases and in the case of forming a Ni film by PVD.
Figure 4:
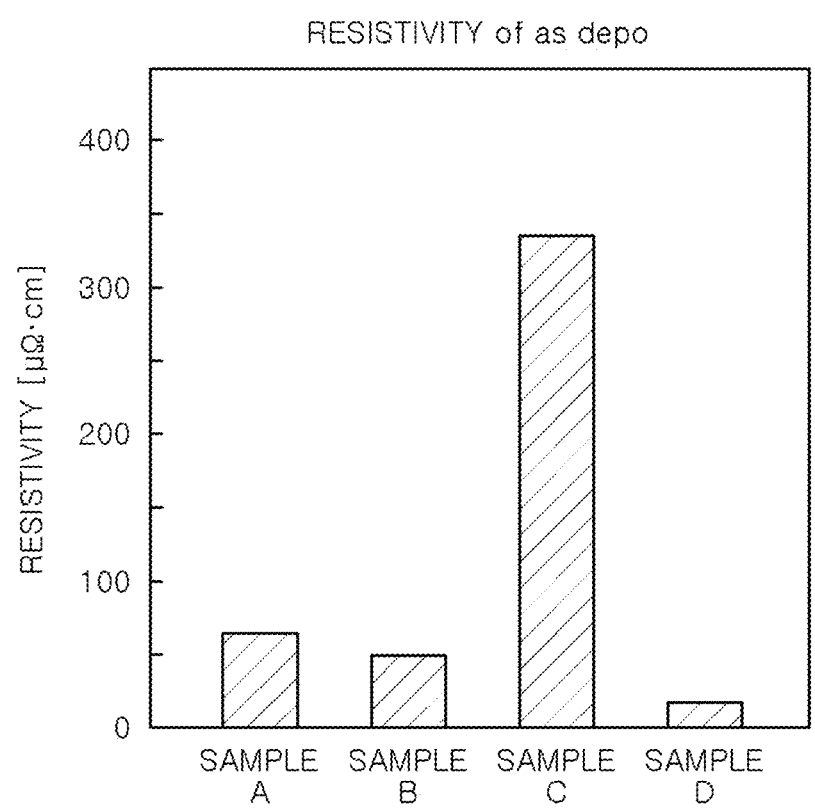
FIG. 4 shows a resistivity in an as-deposited state in the case of forming a Ni film by CVD by using nickel alkyl amidinate and varying a ratio of $NH_3/H_2$ of reduction gases and in the case of forming a Ni film by PVD

FIG. 3 shows transmission type electron microscope (TEM) images in the case of forming a Ni film by CVD using nickel alkyl amidinate while varying the $NH_3/H_2$ ratio (samples A to C) and in the case of forming a Ni film by PVD (sample D) where a target film thickness is 20 nm in all cases. As can be seen from FIG. 3, the morphology is good in the case of using only the $NH_3$ gas. However, as the amount of $H_2$ is increased, the morphology becomes poor. FIG. 4 shows the resistivity of the Ni film in each sample. In the sample C in which only the $NH_3$ gas is used as the reduction gas, the resistivity is considerably high. However, in the samples A and B in which $H_2$ is added to the reduction gas, the resistivity is decreased. FIGS. 5A to 5C show element analysis results in a depth direction of the film, which are obtained by X-ray photoelectron spectroscopy (XPS) in the samples A to C. As can be seen from FIGS. 5A to 5C, in the sample C in which only the $NH_3$ gas is used as the reduction gas, a large amount of N in $NH_3$ remains as impurities in the Ni film. On the other hand, in the sample B in which the $NH_3/H_2$ ratio is 1 (50%/50%), the film has a small amount of impurities and has a metallic property. In the sample A in which the $NH_3/H_2$ ratio is 0.25 (20%/80%), the amount of N as impurities in the Ni film is small, but O is contained in the Ni film. This is because the morphology is poor. Generally, the amount of impurities in the Ni film is decreased as the amount of $NH_3$ is decreased. The reason that the resistivity is higher in the sample A than in the sample B as shown in FIG. 4 is because O is contained in the Ni film in the sample A.

Figure 6:
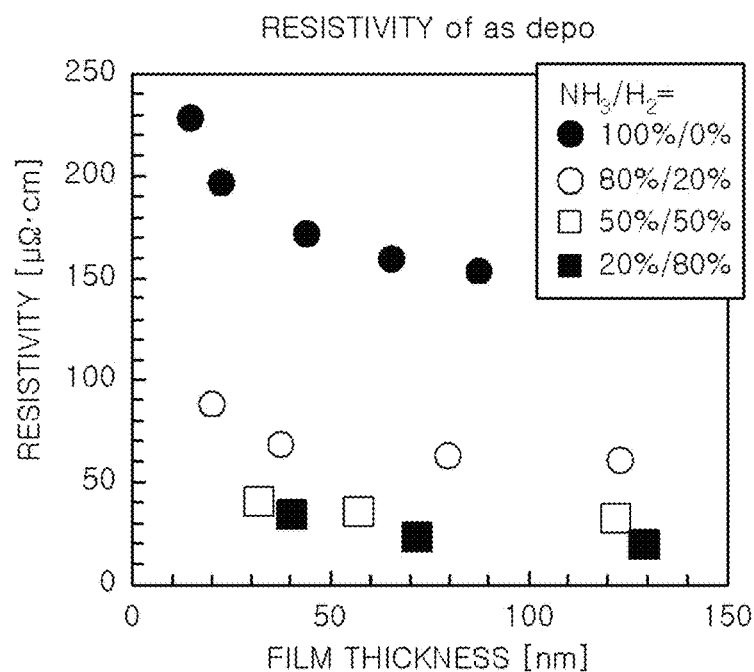
FIG. 6 shows relation between a resistivity and a film thickness in the case of forming a Ni film by CVD while setting percentages of $NH_3$ gas and $H_2$ gas of reduction gases to 100%:0%, 80%:20%, 50%:50% and 20%:80%.

FIG. 6 shows relation between a resistivity and a film thickness in the case of forming a Ni film by CVD while setting the percentages of $NH_3$ gas and $H_2$ gas to 100%:0%, 80%:20%, 50%:50% and 20%:80% and varying the film thickness with respect to each $NH_3/H_2$ ratio. As can be seen from FIG. 6, the resistivity in the percentages of $NH_3$ gas and $H_2$ gas of 100%:0% is higher than those of $NH_3$ gas and $H_2$ gas of 80%:20%, 50%:50% and 20%:80%. From the above, it is clear that the $NH_3/H_2$ ratio is preferably 4 (80%/20%) or less in order to obtain a film having a low resistivity.

The film formation in the step 3 is preferably performed at a temperature ranging from 150° C. to 350° C. The preferable range of the temperature varies depending on a Ni compound to be used. In the case of using nickel amidinate as the Ni compound, the temperature preferably ranges from 150° C. to 350° C. Further, a pressure for film formation is preferably in a range from 133.32 Pa to 1333.2 Pa (1 Torr to 10 Torr).

In the annealing of the step 4, the Ni film 205 on the sidewall of the trench 203 and on the surface of the wafer W is made to reflow (drift) into the trench 203 by heat from the annealing. This reflow of the Ni film 205 formed on the underlying film into the trench by the annealing has been found first by the present inventors. A Cu film of the conventional Cu wiring has poor flow ability on the barrier film such as a TiN film or the like. However, the Ni film has good flow ability on the barrier film. Even when the barrier film is not provided, the Ni film has good flow ability on the underlying interlayer insulating film. By making the Ni film on the surface of the wafer W or on the sidewall of the trench reflow into the trench 203, it is possible to obtain excellent fillability in a fine trench that is not easily filled when a film formation is performed thereon.

A temperature of the annealing process is preferably within a range from 200° C. to 600° C., e.g., 400° C. An atmosphere of the annealing process is not particularly limited. However, the annealing process may be performed under an inert gas atmosphere such as $N_2$ gas or the like or under an $H_2$ gas atmosphere.

The reflow characteristics in the annealing process are improved in the case of using a film having a small amount of impurities and a high metallic property. On the other hand, a Ni film having a large amount of impurities, which is formed by using only $NH_3$ gas as the reduction gas, has poor flow ability and is easily agglomerated without flowing.

Figure 7:
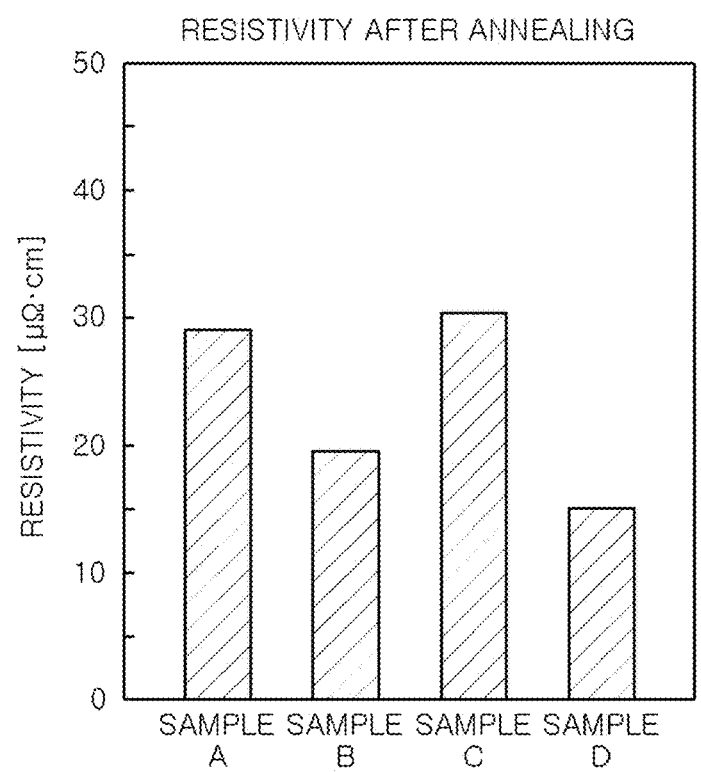
FIG. 7 shows a resistivity after annealing in the case of forming a Ni film by CVD by using nickel alkyl amidinate and varying a ratio of $NH_3/H_2$ of reduction gases and in the case of forming a Ni film by PVD.
Figure 8:
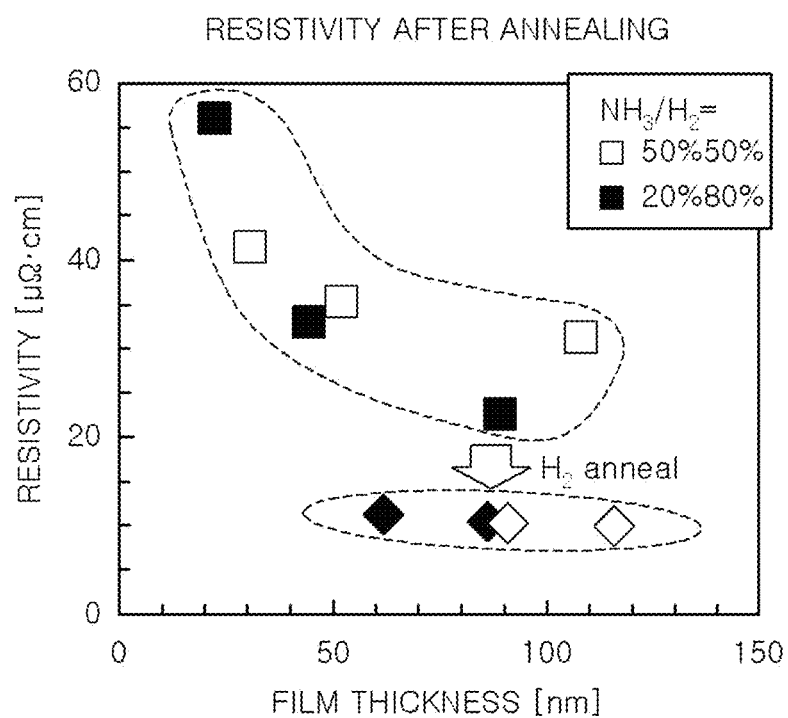
FIG. 8 shows relation between a resistivity and a film thickness in the case of forming a Ni film by CVD while setting a ratio of $NH_3$ gas and $H_2$ gas of reduction gases ($NH_3/H_2$ ratio) to 50%/50% and 20%/80% and then performing annealing.

The annealing process allows crystallization of Ni to occur and reduces the amount of impurities. Therefore, the annealing process contributes to the decrease in resistivity of the Ni film. FIG. 7 shows a resistivity of a Ni film in the case of performing annealing on samples A to D under an $N_2$ atmosphere at 400° C. for 40 minutes. The resistivity was decreased in all the samples compared to that shown in FIG. 4. Especially, the resistivity was considerably decreased in the sample C in which the amount of impurities was large in an as-deposited state. In the sample B in which the film has a small amount of impurities and has a metallic property in the as-deposited state, the resistivity after the annealing was 20 µΩ·cm which was low and close to that of PVD-Ni film in the sample D. FIG. 8 shows relation between a film thickness and a resistivity in the case of forming a Ni film by CVD while setting a $NH_3/H_2$ ratio to 50%/50% and 20%/80% and varying the film thickness with respect to each $NH_3/H_2$ ratio, and then performing annealing under an $H_2$ atmosphere at 600° C. for 10 minutes. The resistivity was about 10 μΩ·cm which was considerably low in all the cases due to the annealing.

By performing the annealing under the $H_2$ gas atmosphere, the effect of removing impurities can be enhanced. However, if the film containing a comparatively large amount of impurities is annealed under the $H_2$ gas atmosphere, agglomeration easily occurs, which should be avoided.

Figure 9:
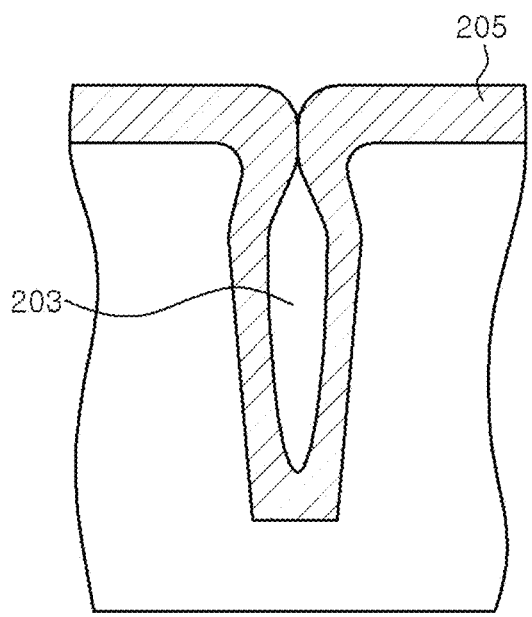
FIG. 9 is a cross sectional view schematically showing a state in which a Ni film is blocked by overhangs that has occurred at an upper portion of a trench in the case of forming the Ni film.

In the film formation of the step 3, if an upper portion of the trench 203 is blocked by the Ni film 205 due to overhang as shown in FIG. 9, it is difficult for the Ni film to reflow into a bottom portion of the trench 203. Therefore, defects may occur at the filling portion of the trench 203. Accordingly, it is preferable to form a thin Ni film 205 such that the upper portion of the trench 203 is not blocked. When it is difficult to form the Ni film 205 having a thickness enough to completely fill the trench 203 by a single process or when a fine trench needs to be filled with good fillability, it is preferable to repeat the film formation and the annealing twice or more.

The film formation and the annealing are repeated twice or more in the following case.

Figure 10A:
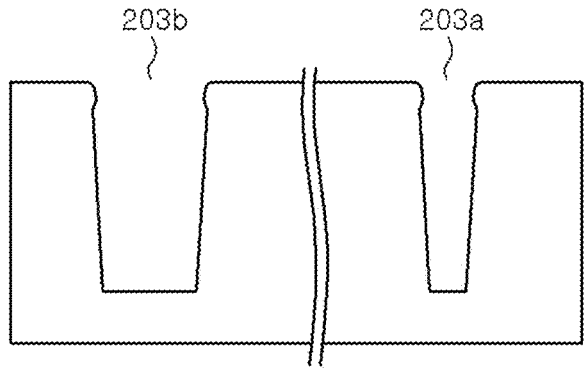
FIGS. 10A to 10C are process cross sectional views for explaining a technique for filling a Ni film in a trench having a small width and in a trench having a large width without blocking upper portions of the trenches by repeating film formation and annealing twice.
Figure 10B:
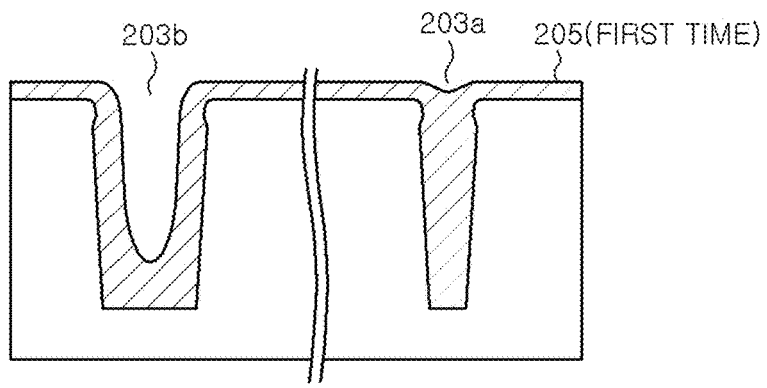
Figure 10C:
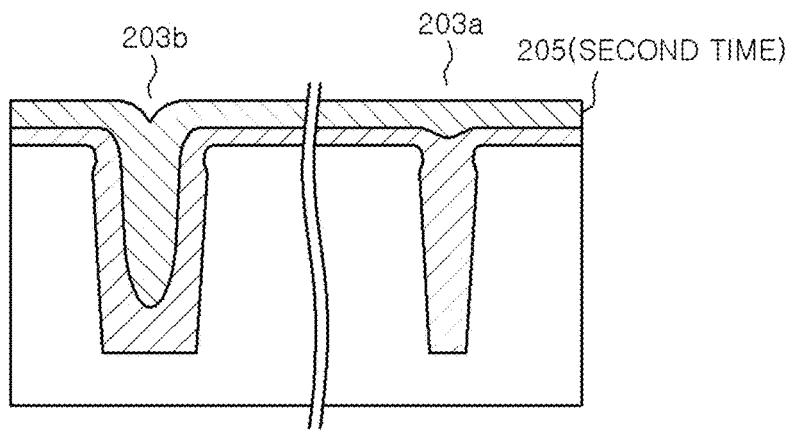

For example, in a wafer W having at least a trench 203a having a small width (e.g., 10 nm to 50 nm) and a trench 203a having a large width (e.g., 50 nm to 100 nm) as shown in FIG. 10A, first formation of the Ni film 205 is performed and, then, the Ni film 205 is made to reflow by first annealing into the trench 203a having a small width (FIG. 10B). At this time, the trench 203b having a large width is not completely filled. Next, second formation of the Ni film 205 is performed and, then, the Ni film 205 is made to reflow by second annealing into the trench 203b having a large width (FIG. 10C). Accordingly, the trenches having different widths can be filled while ensuring good fillability without blocking upper portions of the trenches.

In this case, the thickness of the Ni film obtained by the first film formation is preferably smaller than the thickness of the Ni film obtained by the second film formation. Accordingly, it is possible to fill the trench 203a having a small width without blocking an upper portion thereof by the first annealing and then fill the trench 203b having a large width by the second annealing.

The $NH_3/H_2$ ratio of the reduction gases in the second Ni film formation is preferably lower than the $NH_3/H_2$ ratio of the reduction gases in the first Ni film formation. In other words, the amount of $H_2$ gas in the reduction gases is preferably larger in the second Ni film formation than in the first Ni film formation. This is because the morphology of the Ni film obtained by the second Ni film formation to fill the trench 203b having a large width by the second annealing may be lower than that of the Ni film obtained by the first Ni film formation to fill the trench 203a having a small width by the first annealing, and also because it is preferable to decrease a resistance by increasing a ratio of $H_2$ gas.

As described above, by repeating the film formation and the annealing twice or more, the resistivity of the Ni film is further decreased.

Figure 11A:
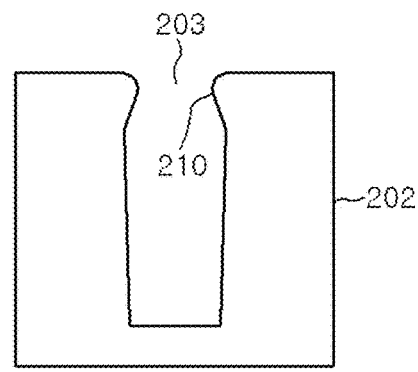
FIGS. 11A to 11C are process cross sectional views for explaining a technique for filling a Ni film without blocking an upper portion of a trench by performing etch-back on an underlying interlayer insulating film.
Figure 11B:
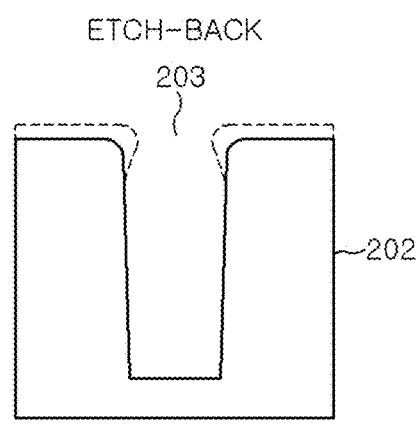
Figure 11C:
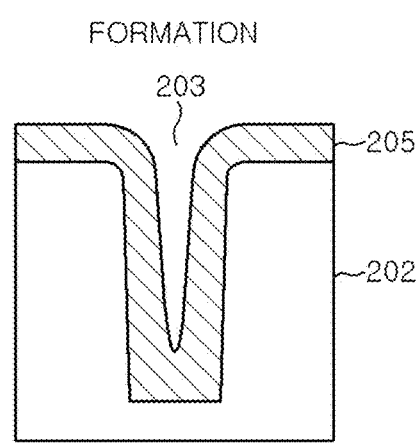

Instead of repeating the film formation and the annealing twice or more, the etch-back may be performed on the interlayer insulating film (underlying film) 202 before the formation of the Ni film to prevent the upper portion of the trench 203 from being blocked by the Ni film 205. In other words, protruded portions 210 may be formed at the trench 203 in a state where the trench 203 is formed in the interlayer insulating film (underlying film) 202 as shown in FIG. 11A. However, the protruded portions 210 formed at the trench 203 are etched by performing etch-back on the underlying interlayer insulating film (underlying film) 202 and, thus, the width of the trench 203 is increased as shown in FIG. 11B. Accordingly, when the Ni film 205 fills the trench 203, the occurrence of overhang at the upper portion of the trench 203 is prevented as shown in FIG. 11C.

It is also possible to perform both of the etch-back of the underlying interlayer insulating film (underlying film) 202 and the repetition of the film formation and the annealing twice or more. As a consequence, the upper portion of the trench 203 can be more effectively prevented from being blocked by the Ni film 205.

As described above, in the present embodiment, the Ni film 205 is formed by CVD or ALD and, then, the formed Ni film 205 is made to reflow into the trench 203 by annealing. Therefore, the fine trench is filled and the Ni wiring can be formed. Since a mean free path of an electron of Ni is considerably shorter than that of Cu, the lower resistivity can be obtained in the case of using the Ni wiring as fine wiring than in the case of using the Cu wiring. Further, the Ni wiring does not require a barrier film or a liner film which is required in the Cu wiring. Thus, even when the barrier film is required, its thickness can be smaller than that in the Cu wiring. Accordingly, the volume of the Ni film in the wiring can be increased, and the resistance of the wiring can be further reduced.

In the case of forming the Ni film 205 by CVD or ALD, the morphology of the film and the amount of impurities can be controlled by controlling a ratio of $NH_3$ gas and $H_2$ gas of the reduction gases for reducing the Ni compound gas. Accordingly, the fine trench 203 can be filled with the low-resistance Ni film without defects.

By using nickel amidinate as the Ni compound gas, the Ni film can fill the fine trench while ensuring high step coverage and, thus, further improved fillability can be obtained.

Test Examples

Hereinafter, test examples will be described.

Test Example 1

Here, there was prepared a wafer having an $SiO_2$ film formed on an Si base by CVD using tetraethyl orthosilicate (TEOS) and a plurality of trenches, each having an actual CD (middle CD) of 30 nm to 150 nm and a depth of 200 nm, formed on the $SiO_2$ film.

A TiN film having a thickness of 1 nm was formed as a barrier film on the wafer having the above structure by CVD and, then, a Ni film having a thickness of 20 nm was formed thereon. The Ni film was formed at 250° C. by using nickel alkyl amidinate that is a Ni compound as a film forming material and $NH_3$ gas and $H_2$ gas as reduction gases. The percentages of $NH_3$ and $H_2$ gas as the reduction gases were set to 20%:80%, 50%:50% and 100%:0% ($NH_3$ used only). Then, the annealing process was performed under the $N_2$ gas atmosphere at 400° C. for 40 minutes to reflow the Ni film.

FIGS. 12A and 12B show TEM images of cross sections in an as-deposited state and after the annealing. As can be seen from these images, in the as-deposited state, the morphology of the film was improved as the ratio of $NH_3$ gas was increased. However, seams remained in all the trenches, which resulted in defects (FIG. 12A). On the other hand, in the case of forming a Ni film and making the Ni film reflow by performing annealing, voids were generated in the trenches when the $NH_3/H_2$ ratio was 20%/80% and when only $NH_3$ gas was used, and good fillability was obtained when the $NH_3/H_2$ ratio was 50%/50% (FIG. 12B). This is because the morphology is poor when the $NH_3/H_2$ ratio is 20%/80% and the amount of impurities is large when only $NH_3$ gas is used, whereas the morphology is within a tolerable range and the amount of impurities is small when the $NH_3/H_2$ ratio is 50%/50%.

Test Example 2

Here, there was prepared a wafer having an $SiO_2$ film formed on an Si base by CVD using TEOS and a plurality of trenches, each having an actual CD (middle CD) of 30 nm to 150 nm and a depth of 200 nm, formed in the $SiO_2$ film.

A TiN film having a thickness of 1 nm was formed as a barrier film on the wafer having the above structure by CVD and, then, a Ni film having a thickness of 20 nm was formed thereon. The Ni film was formed at 250° C. by using nickel alkyl amidinate that is a Ni compound as a film forming material and $NH_3$ gas and $H_2$ gas as reduction gases. The percentages of $NH_3$ gas and $H_2$ gas were set to 50%:50% and 100%:0% ($NH_3$ used only).

Before the film formation, the etch-back of the $SiO_2$ film was performed (etching gas: $C_4F_8$, $O_2$, Ar) to increase the width of the trench. Next, there was prepared a sample in which a TiN film having a thickness of 1 μm was formed as a barrier film by CVD and a Ni film having a thickness of 30 nm was formed thereon. At this time, the Ni film forming condition was the same as the above condition.

In this sample in which the etch-back was performed, after the formation of the Ni film, an annealing process was performed under an $N_2$ gas atmosphere at 400° C. for 40 minutes to make the Ni film reflow.

Further, before the film formation, the etch-back of the $SiO_2$ film was performed (etching gas: $C_4F_8$, $O_2$, Ar) to increase the width of the trench. Next, there was prepared a sample in which a TiN film having a thickness of 1 μm was formed as a barrier film by CVD; a Ni film having a thickness of 20 nm was formed while setting the $NH_3/H_2$ ratio of the reduction gases to 50%/50%; and an annealing process was performed under the same condition as the above condition. In this sample, the formation of the Ni film and the annealing process were repeated twice.

Figures 13A, 13B, 13C, 13D:
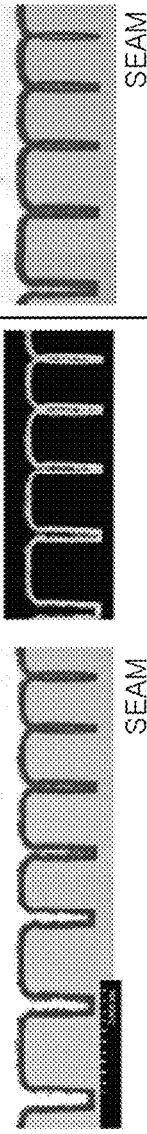
FIGS. 13A to 13D show TEM images of cross sections in as deposited state, after etch-back and film formation, after etch-back, film formation and annealing, and after etch-back and (film formation and annealing)×2 in a test example 2.

FIGS. 13A to 13D show TEM images of cross sections of these samples. As can be seen from the TEM images, in an as-deposited state, seams remained in all the trenches, which resulted in defects (FIG. 13A). On the other hand, in the case of performing etch-back and then film formation, the morphology was good when only $NH_3$ gas was used as the reduction gas and, thus, good fillability was obtained in the film formation step. However, when the $NH_3/H_2$ ratio was 50%/50%, seams were not clearly seen in the film formation step, whereas defects remained (FIG. 13B). By performing the annealing process, agglomeration of Ni occurred at the upper portions of the trenches only when $NH_3$ gas was used as the reduction gas. When the $NH_3/H_2$ ratio was 50%/50%, Ni was made to reflow into the trenches by the annealing process. Therefore, the trenches having a CD of 50 nm or less were filled with good fillability, whereas the trenches having a CD of more than 50 nm were not sufficiently filled (FIG. 13C). In the case of repeating the formation of the film having a thickness of 20 nm while setting the ratio of the $NH_3/H_2$ of the reduction gases to 50%/50% and the annealing process twice, all the trenches were filled with good fillability without defects (FIG. 13D).

Test Example 3

Here, measurement results of resistivities in the case of forming actual Ni wiring under different conditions will be described.

There was prepared a wafer having an $SiO_2$ film formed on an Si base having a predetermined underlying structure by CVD using TEOS and a plurality of trenches, each having an actual CD (middle CD) of about 30 nm, formed in the $SiO_2$ film. In the wafer having the above structure, a TiN film having a thickness of 1 nm was formed as a barrier film by CVD and, then, the Ni film was filled under different conditions. Next, a Ni film having a thickness of 100 nm was formed as an additional layer by PVD and the CMP was performed for three minutes.

The Ni film was filled under four conditions including: forming a film having a thickness of 30 nm by using nickel alkyl amidinate that is a Ni compound as a film forming material while setting a ratio of $NH_3/H_2$ of the reduction gases to 50%/50% without performing annealing (condition 1); forming a Ni film under the same condition as the above film forming condition and performing annealing under an $N_2$ gas atmosphere at 400°0 for 40 minutes (condition 2); repeating twice formation of a Ni film having a thickness of 20 nm under the same condition as the above film forming condition and annealing under the same condition as the above annealing condition (condition 3); and forming a film having a thickness of 30 nm by using only $NH_3$ gas as a reduction gas without performing annealing (condition 4). The resistivity was measured under the respective conditions.

FIG. 14 shows TEM images of cross sections of Ni wirings formed under the respective conditions, actual CD values and resistivities. As can be seen from these TEM images, under the condition 1, the fillability was not sufficient and the resistivity was 45.8 μΩ·cm which was high. On the other hand, under the condition 2 in which the film was made to reflow by the annealing, the fillability was improved compared to that in the condition 1 and the resistivity was decreased to 23.6 μΩ·cm. Under the condition 3 in which the film formation and the reflow of the film by the annealing were repeated twice, small trenches were seen at the bottom portions of the trenches and the resistivity was 21.1 μΩ·cm which was lowest. Under the condition 4 in which the Ni film was formed by using only $NH_3$ gas as the reduction gas, loss of Ni in the trenches occurred by the CMP and, thus, the resistivity was not measurable.

Test Example 4

Here, measurement results of resistivities in the case of forming actual Ni wiring while varying CD will be described.

As in the test example 3, there was prepared a plurality of wafers, each having an $SiO_2$ film formed on an Si base having a predetermined underlying structure by CVD using TEOS and a plurality of trenches formed on the $SiO_2$ film while varying CD. The CD of the trenches on each wafer was set to 53 nm, 41 nm, 35 nm and 30 nm. In each of the wafers, a TiN film having a thickness of 1 nm was formed as a barrier film by CVD and, then, the Ni film was filled by repeating twice the film formation and the reflow of the film by annealing under the same condition as the condition 3 in the test example 3. Next, a Ni film having a thickness of 100 nm was formed as an additional layer by PVD and, then, CM was performed for three minutes. The resistivity at that time was measured.

Figure 15:
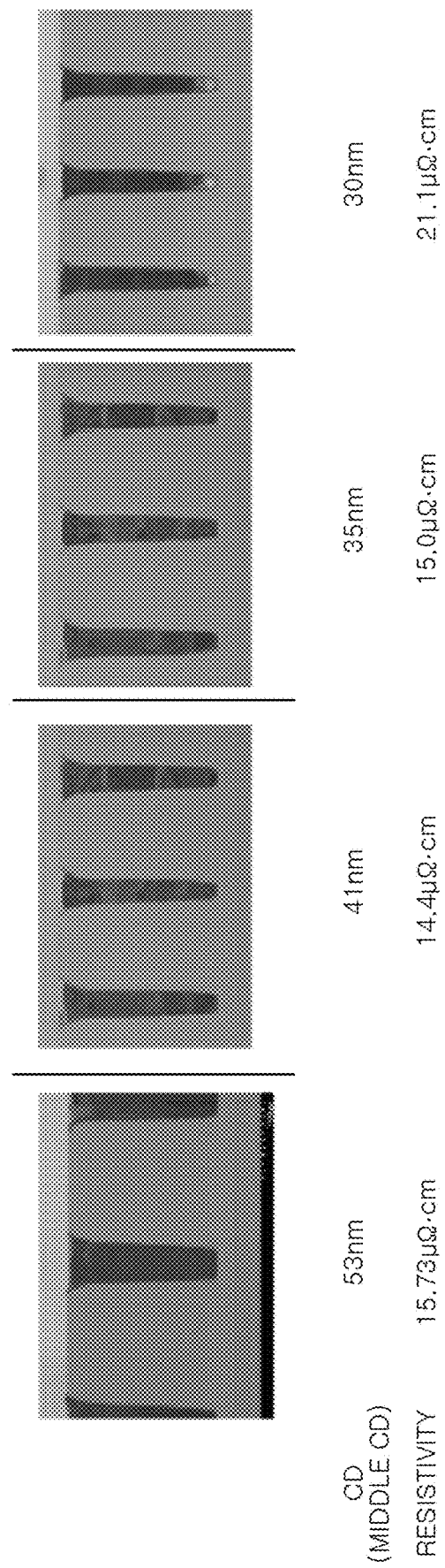
FIG. 15 shows TEM images in the case of varying CD under the same condition as the condition 3 of the test example 3, actual CD values and resistivities in a test example 4.

FIG. 15 shows TEM images of cross sections of Ni wirings formed under the above conditions, actual CD values and resistivities. As can be seen from the TEM images, when CD was 35 nm or above, good fillability was obtained and the resistivity was about 15 μΩ·cm which was low. When CD was 30 nm, small voids were seen at the bottom portions of the trenches and the resistivity was 21.1 μΩ·cm which was slightly higher. From this, it is expected that the Ni film can be filled with good fillability and the low resistivity of about 15 μΩ·cm can be obtained even when CD is 30 nm or less by optimizing the Ni film embedding condition.

<Film Forming System>

Hereinafter, an example of a film forming system used for performing the Ni wiring manufacturing method will be described.

Figure 16:
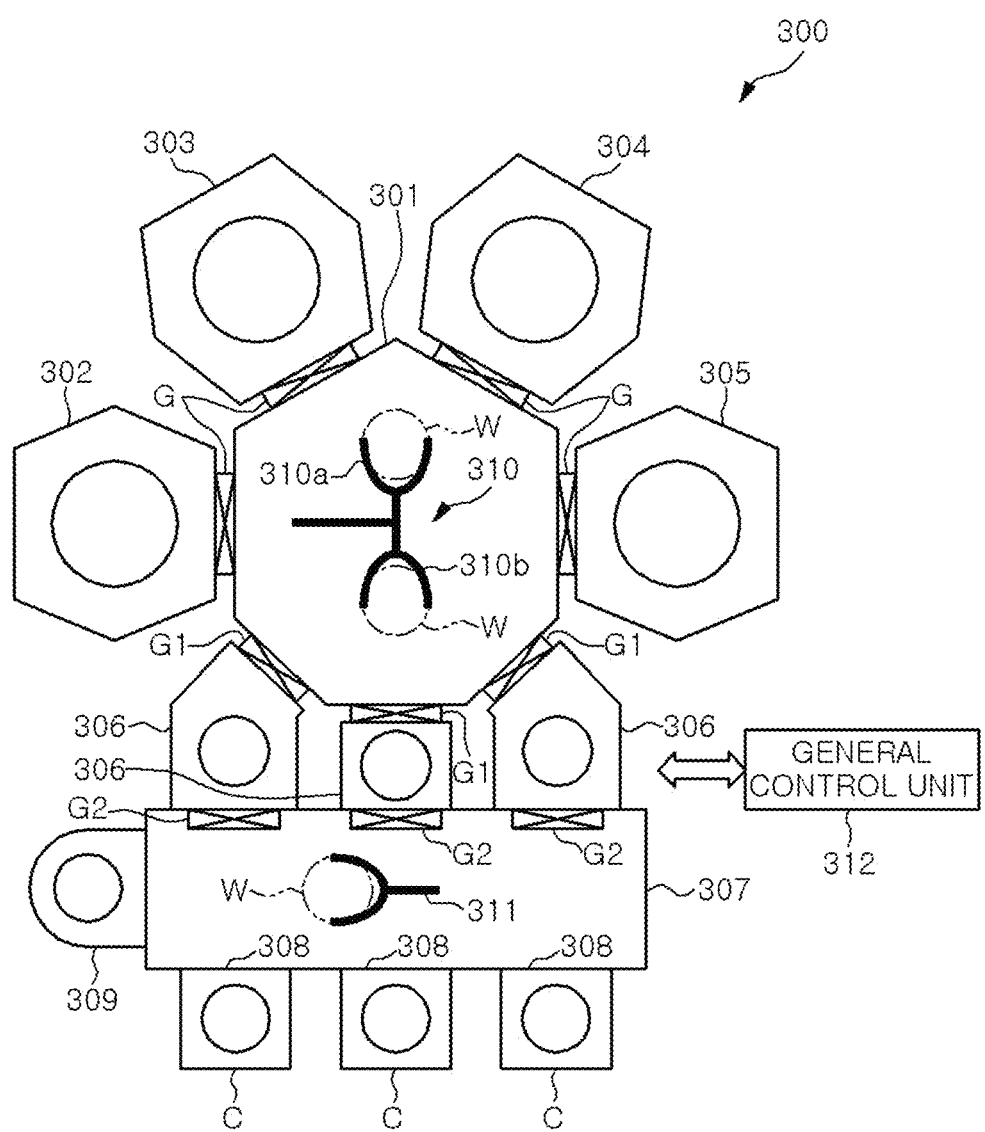
FIG. 16 is a horizontal cross sectional view schematically showing an example of a film forming system used for performing the Ni wiring manufacturing method.

FIG. 16 is a horizontal cross sectional view schematically showing an example of the film forming system.

As shown in FIG. 16, a film forming system 300 of this example includes a vacuum transfer chamber 301 having a heptangular shape when seen from top. A TiN film forming apparatus 302, a Ni film forming apparatus 303, an annealing apparatus 304 and an additional layer forming apparatus 305 are connected to four walls of the vacuum transfer chamber 301 via gate valves G. The TiN film forming apparatus 302 forms a TiN film as a barrier film by CVD or ALD. The Ni film forming apparatus 303 forms a Ni film for filling a trench by CVD or ALD. The annealing apparatus 304 makes the Ni film reflow into the trench by annealing the wafer after the Ni film formation. The additional layer forming apparatus 305 forms a Ni film as an additional layer on the Ni film to be filled by PVD or CVD to prepare for a next CMP process. The vacuum transfer chamber 301 is exhausted by a vacuum pump and the pressure in the vacuum transfer chamber 301 is maintained at a predetermined vacuum level.

Three load-lock chambers 306 are connected to the other three walls of the vacuum transfer chamber 301 via gate valves G1. An atmospheric transfer chamber 307 is provided at a side of the load-lock chambers 306 which is opposite to a side where the vacuum transfer chamber 301 is connected. The three load-lock chambers 306 are connected to the atmospheric transfer chamber 307 via gate valves G2. The load-lock chambers 306 controls a pressure between an atmospheric pressure and vacuum when the wafer W is transferred between the atmospheric transfer chamber 307 and the vacuum transfer chamber 301.

Three carrier installation ports 308 where carriers (FOUPs or the like) C accommodating wafers W are installed at a wall of the atmospheric transfer chamber 307 opposite to the wall where the load-lock chambers 306 are provided. An alignment chamber 307 for performing alignment of the wafer W is provided at a sidewall of the atmospheric transfer chamber 307. A downflow of clean air is formed in the atmospheric transfer chamber 307.

A wafer transfer unit 310 is provided in the vacuum transfer chamber 301. The wafer transfer unit 310 transfers the wafer W to the TiN film forming apparatus 302, the Ni film forming apparatus 303, the annealing apparatus 304, the additional layer forming apparatus 305 and the load-lock chambers 306. The wafer transfer unit 310 has two separately movable transfer arms 310a and 310b.

A wafer transfer unit 311 is provided in the atmospheric transfer chamber 307. The wafer transfer unit 311 transfers the wafer W to the carriers C, the load-lock chambers 306 and the alignment chamber 309.

The film forming system 300 includes a general control unit 312. The overall control unit 312 includes a main controller having a CPU (computer) for controlling the respective components of the TiN film forming apparatus 302, the Ni film forming apparatus 303, the annealing apparatus 304 and the additional layer forming apparatus 305, the gas exhaust unit and the wafer transfer unit 310 of the vacuum transfer chamber 301, the gas exhaust units and the gas supply units of the load-lock chambers 306, the wafer transfer unit 311 of the atmospheric transfer chamber 307, driving systems of the gate valves G, G1 and G2, and the like. The overall control unit 312 further includes an input device (a keyboard, a mouse or the like), an output device (a printer or the like), a display device (a display or the like) and a storage unit (a storage medium). The main controller of the overall control unit 312 allows the film forming system 300 to perform a predetermined operation based on a processing recipe stored in a storage medium set in the storage unit or in a storage medium installed in the storage unit. The overall control unit 312 also controls a CMP apparatus (not shown).

The film forming system 300 and the CMP apparatus constitute the Ni wiring manufacturing system.

Next, the Ni film forming apparatus 303 as a main component of the film forming system 300 will be described.

Figure 17:
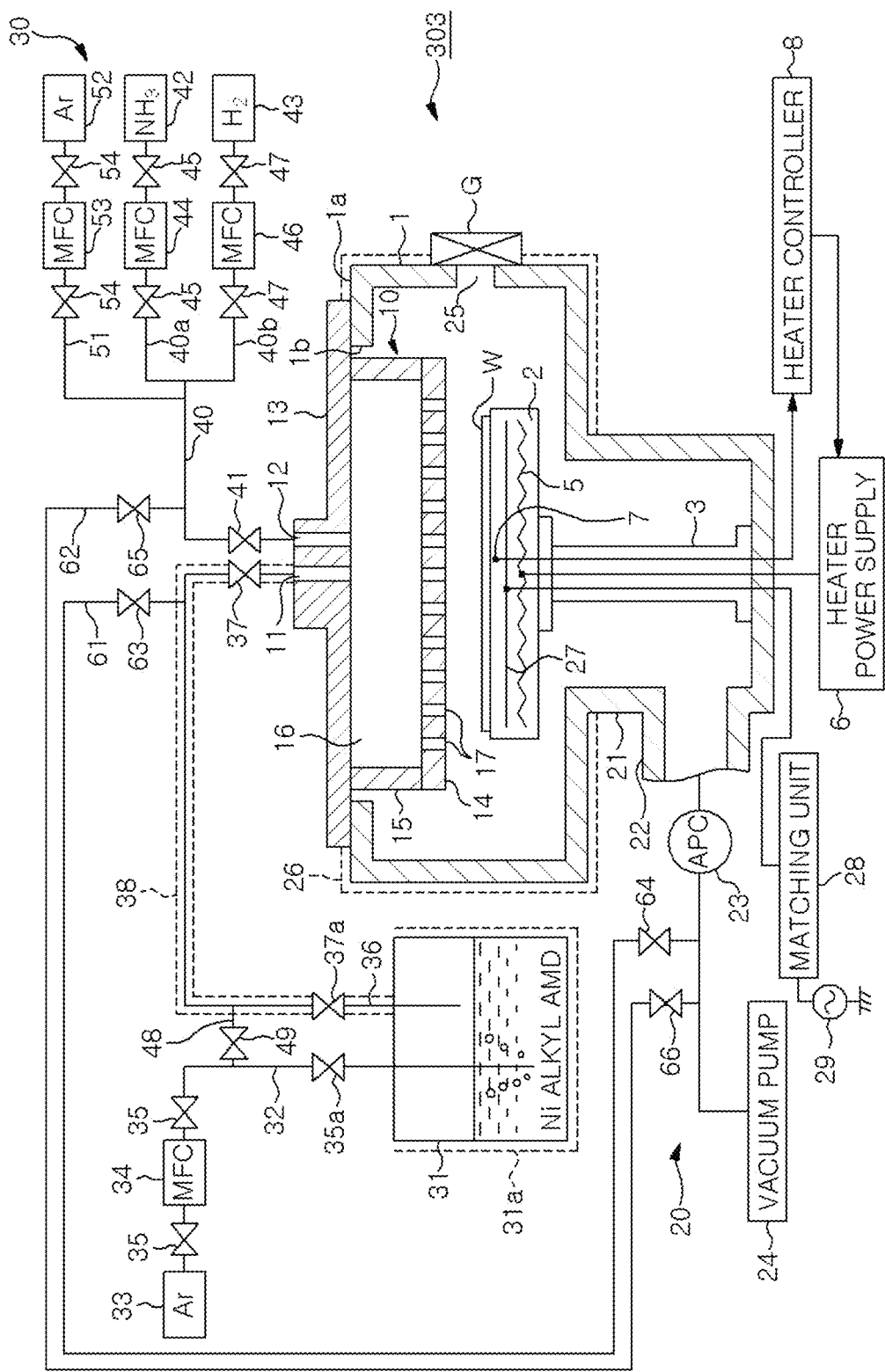
FIG. 17 is a cross sectional view schematically showing an example of a Ni film forming apparatus installed in the film forming system shown in FIG. 16.

FIG. 17 is a cross sectional view showing an example of the Ni film forming apparatus 303. The Ni film forming apparatus 303 has a substantially cylindrical chamber 1 that is airtightly sealed. In the chamber 1, a susceptor 2 for horizontally supporting a wafer W as a target substrate is supported by a cylindrical supporting member 3 extending from a bottom portion of a gas exhaust chamber to be described later to a central bottom portion of the chamber 1. The susceptor 2 is made of ceramic, e.g., AlN or the like. A heater 5 is embedded in the susceptor 2. A heater power supply 6 is connected to the heater 5. A thermocouple 7 is provided near a top surface of the susceptor 2. A signal of the thermocouple 7 is transmitted to a heater controller 8. The heater controller 8 transmits a command to the heater power supply 6 in response to the signal of the thermocouple 7 and controls the wafer W to a predetermined temperature by controlling heating of the heater 5. An electrode 27 to which a high frequency power is applied is installed above the heater 5 in the susceptor 2. A high frequency power supply 29 is connected to the electrode 27 through a matching unit 28. A high frequency power is applied to the electrode 27, if necessary, to generate a plasma. Accordingly, plasma CVD can be performed. The susceptor 2 is provided with three wafer elevating pins (not shown) capable of protruding beyond and retreat below the surface of the susceptor 2. When the wafer W is transferred, the wafer elevating pins protrude beyond the surface of the susceptor 2. The susceptor 2 is vertically movable by an elevation unit (not shown).

A gas exhaust chamber 21 protruding downward is provided at the bottom wall of the chamber 1. The chamber 1 is exhausted by the gas exhaust unit 20 through the gas exhaust chamber 21. The gas exhaust unit 20 includes: a gas exhaust line 22 connected to the side surface of the gas exhaust chamber 21; an adaptive pressure control (APC) valve 23, disposed in the gas exhaust line 22, for controlling a pressure in the chamber 1; and a vacuum pump 24 for exhausting the chamber 1 through the gas exhaust line 22.

Formed on a sidewall of the chamber 1 is a loading/unloading port 25 through which the wafer W is loaded and unloaded. The loading/unloading port 25 is connected to the vacuum transfer chamber 301 through the gate valve G.

A circular opening 1b is formed at a ceiling wall 1a of the chamber 1. The shower head 10 is inserted thereinto from the circular opening 1b to protrude into the chamber 1. The shower head 10 injects a film forming gas supplied from a gas supply unit 30 to be described later into the chamber 1. A first inlet line 11 for introducing a nickel compound gas as a film forming material gas and a second inlet line 12 for introducing $NH_3$ gas and $H_2$ gas as reduction gases are provided at an upper portion of the shower head 10. The shower head 10 includes a base member 13, a shower plate 14, and a cylindrical sidewall 15 provided between the base member 13 and the shower plate 14. A gas diffusion space 16 is formed in the shower head 10. A plurality of gas injection holes 17 is formed in the shower plate 14. The shower head 10 is heated by a heater (not shown).

The gas supply unit 30 includes a film forming material tank 31 for storing the above-mentioned Ni compound as a film forming material. The film forming material tank 31 stores therein the Ni compound, e.g., nickel alkyl amidinate dissolved in an appropriate solvent (e.g., tetralin solvent). A heater 31a is provided around the film forming material tank 31. The film forming material in the film forming material tank 31 can be heated to an appropriate temperature. In the case of using a material in a liquid state at a room temperature as the nickel-containing compound, the material can be stored without being dissolved in a solvent.

A bubbling line 32 for supplying Ar gas as a bubbling gas from above is inserted into the film forming material tank 31 and immersed in the film forming material. An Ar gas supply source 33 is connected to the bubbling line 32. A mass flow controller 34 as a flow rate controller and valves 35 disposed at both sides of the mass flow controller 34 are installed in the bubbling line 32. A source gas feed line 36 is inserted from above into the film forming material tank 31. The other end of the source gas feed line 36 is connected to the first inlet line 11 of the shower head 10. A valve 37 is installed in the source gas feed line 36. A heater 38 for preventing condensation of the film forming material gas is provided in the source gas feed line 36. By supplying Ar gas as the bubbling gas to the film forming material, the film forming material is vaporized by bubbling in the film forming material tank 31. The film forming material gas thus generated is supplied into the shower head 10 through the source gas feed line 36 and the first inlet line 11.

The bubbling line 32 and the source gas feed line 36 are connected by a bypass line 48. A valve 49 is installed in the bypass line 48. Valves 35a and 37a are respectively provided at a downstream side of the connecting portions of the line 48 in the bubbling line 32 and the source gas feed line 36. By closing the valves 35a and 37a and opening the valve 49, Ar gas supplied from the Ar gas supply source 33 can be supplied as a purge gas or the like into the chamber 1 through the bubbling line 32, the bypass line 48 and the source gas feed line 36. Another inert gas such as $N_2$ gas or the like may be used instead of Ar gas.

A line 40 is connected to the second inlet line 12 of the shower head 10. A valve 41 is provided in the line 40. The line 40 is branched into branch lines 40a and 40b. An $NH_3$ gas supply source 42 is connected to the branch line 40a. An $H_2$ gas supply source 43 is connected to the branch line 40b. A mass flow controller 44 as a flow rate controller and valves 45 disposed at both sides of the mass flow controller 44 are provided in the branch line 40a. A mass flow controller 46 as a flow rate controller and valves 47 disposed at both sides of the mass flow controller 46 are provided in the branch line 40b. An Ar gas line 51 is connected to the line 40. An Ar gas supply source 52 for supplying Ar gas as a purge gas or the like is connected to the Ar gas line 51. A mass flow controller 53 as a flow rate controller and valves 54 disposed at both sides of the mass flow controller 53 are provided in the Ar gas line 51. Another inert gas may be used instead of Ar gas.

In the case of performing the plasma CVD by applying a high frequency power to the electrode 27, if necessary, Ar gas supplied from the Ar gas supply source 52 may be used for plasma ignition.

A first pre-flow line 61 is connected to the source gas feed line 36. A second pre-flow line 62 is connected to the line 40. The first and the second pre-flow line 61 and 62 are connected to the gas exhaust line 22 to allow pre-flow in which the Ni compound gas as the source gas and the reduction gas are exhausted without passing through the chamber 1. In the first pre-flow line 61, valves 63 and 64 are provided near the line 40 and the gas exhaust line 22, respectively. In the second pre-flow line 62, valves 65 and 66 are provided near the line 40 and the gas exhaust line 22, respectively. The pre-flow and the supply of the gas to the chamber 1 can be switched by these valves.

In the film forming system 300 configured as described above, a carrier C accommodating a predetermined number of wafers W is connected to the carrier installation port 308 of the atmospheric transfer chamber 307. As shown in FIG. 2A, each of the wafers W has an interlayer insulating film (underlying film) 202 formed on a base 201 having a predetermined underlying structure (not shown) and a trench (recess) 203 formed in a predetermined pattern in the interlayer insulating film (underlying film) 202. First, a wafer W is unloaded from the carrier C by the wafer transfer unit 311 and loaded into any one of the load-lock chambers 206 by opening the gate valve G2. Then, the gate valve G2 is closed and the load-lock chamber 306 is vacuum-evacuated.

When the pressure in the load-lock chamber 306 reaches a predetermined vacuum level, the gate valve G1 is opened and the wafer W is unloaded from the load-lock chamber 306 by the wafer transfer unit 310. Next, the gate valve G of the TiN film forming apparatus 302 is opened and the wafer W held by the wafer transfer unit 310 is loaded into the chamber of the TiN film forming apparatus 302. Thereafter, a TiN film as a barrier film is formed by CVD or ALD by supplying, e.g., $TiCl_4$ gas, as a source gas and $NH_3$ gas as a nitriding gas into the chamber.

After the formation of the TiN film, the wafer W is unloaded from the TiN film forming apparatus 302 by the wafer transfer unit 310. Then, the gate valve G of the Ni film forming apparatus 303 is opened and the wafer W held by the wafer transfer unit 310 is loaded into the chamber 1 of the Ni film forming apparatus 303. Next, a Ni film forming process as a main process is performed.

Hereinafter, the Ni film forming process will be described in detail.

After the wafer W is loaded into the chamber 1 of the Ni film forming apparatus 303 by the wafer transfer unit 310, the wafer W is mounted on the mounting table 2. Then, the wafer transfer unit 310 is retreated to the vacuum transfer chamber 301 and the gate valve G is closed. The wafer W on the mounting table 2 is heated to a predetermined temperature, e.g., a temperature ranging from 200° C. to 300° C., by the heater 5. The chamber 1 is exhausted by the gas exhaust unit 20 and the pressure in the chamber 1 is controlled by supplying Ar gas as a purge gas from the Ar gas supply sources 33 and 52. Then, bubbling is performed by supplying Ar gas from the Ar gas supply source 33 to the film forming material tank 31 through the bubbling line 32. The pre-flow of nickel alkyl amidinate as the Ni compound gas is performed through the source gas feed line 36 and the first pre-flow line 61. The pre-flow of NH₃ gas from the NH₃ gas supply source 42 is performed through the branch line 40a, the line 40 and the second pre-flow line 62.

Then, NH₃ gas is supplied into the chamber 1 by switching the valves 65, 66 and 41 and then adsorbed onto the surface of the wafer W. Next, nickel alkyl amidinate gas as the Ni compound gas in the film forming material tank 31 is supplied into the chamber 1 by switching the valves 63, 64 and 37 and H₂ gas is supplied as the reduction gas in addition to NH₃ gas, thereby forming a Ni film. At this time, the Ni film may be formed by CVD by simultaneously supplying nickel alkyl amidinate as the Ni compound gas and NH₃ gas and H₂ gas as the reduction gases. Or, the Ni film may be formed by ALD by alternately supplying nickel alkyl amidinate gas and a reduction gas with a process of purging the chamber 1 interposed therebetween.

Accordingly, the trench formed in the wafer W is partially filled with the Ni film. At this time, since NH₃ gas is already adsorbed onto the surface of the wafer W, the adsorption properties of nickel alkyl amidinate as the Ni compound gas can be improved and the Ni film can be formed while ensuring high step coverage.

After the trench is partially filled with the Ni film, the supply of nickel alkyl amidinate gas as the Ni compound gas and the supply of the reduction gas are stopped and the inside of the chamber 1 is purged. Then, the gate valve G is opened and the wafer W after the formation of the Ni film is unloaded from the chamber 1 by the wafer transfer unit 310. Next, the gate valve G of the annealing apparatus 304 is opened and the wafer W held by the wafer transfer unit 310 is loaded into the chamber of the annealing apparatus 304. In the annealing apparatus 304, an atmosphere in the chamber is set to a predetermined atmosphere, e.g., an inert gas atmosphere such as N₂ gas atmosphere or the like, and the wafer W is annealed for a predetermined period of time at a temperature ranging from 200° C. to 600° C., e.g., 400° C. Then, the Ni film on the surface of the wafer W or on the side surface of the trench is made to reflow into the trench.

The Ni film formation of the Ni film forming apparatus 303 and the annealing of the annealing apparatus 304 may be repeated twice or more.

After the annealing process, the wafer W is unloaded from the annealing apparatus 304 by the wafer transfer unit 310. Then, the gate valve of the additional layer forming apparatus 305 is opened and the wafer W held by the wafer transfer unit 310 is loaded into the chamber of the additional layer forming apparatus 305. Next, a Ni film is formed as an additional layer by PVD or CVD in the chamber. In the case of forming the additional layer by PVD, the additional layer forming apparatus 305 may be connected to another vacuum transfer chamber to make pressure control easier.

After the additional layer is formed, the wafer W is unloaded by the wafer transfer unit 310. The gate valve G1 is opened and the wafer W is transferred from the wafer transfer unit 310 to the load-lock chamber 306. The gate valve G1 is closed and the pressure in the load-lock chamber 306 is returned to an atmospheric pressure. Thereafter, the gate valve G2 is opened and the wafer W in the load-lock chamber 306 is returned to the carrier C by the wafer transfer unit 311.

By simultaneously performing the above processes on a plurality of wafers W, a series of processes for a number of wafers W mounted on the carrier C is completed.

Next, the carrier C is transferred to the CMP apparatus (not shown). The wafers W are unloaded from the carrier C one by one and subjected to the CMP process. The additional layer, the Ni film and the barrier film in a field portion other than the trench are removed for planarization. Accordingly, fine Ni wiring can be formed.

<Other Applications>

While the embodiments have been described, the present disclosure is not limited to the above embodiments and may be variously modified within the technical scope of the present disclosure. For example, the film forming system and the Ni film forming apparatus used in the above embodiment are merely examples, and the present disclosure is not limited to the above embodiments.

In the above embodiments, the Ni wiring was manufactured by filling a trench by forming a Ni film on an interlayer insulating film where the trench is formed. However, it is not limited thereto, and the Ni wiring may also be manufactured by filling a recess such as a hole or the like which is formed on a substrate by forming a Ni film.

In the above embodiments, the wafer has been described as a target substrate. However, the target substrate is not limited thereto and may be another substrate, e.g., an FPD substrate represented by a liquid crystal display device, a ceramic substrate or the like.

While the present disclosure has been shown and described with respect to the embodiments, it will be understood by those skilled in the art that various changes and modifications may be made without departing from the scope of the present disclosure as defined in the following claims.

What is claimed is:

1. A method for manufacturing Ni wiring, the method comprising:
    forming a Ni film on a surface of a substrate having a recess formed thereon by CVD or ALD by using a Ni compound as a film forming material and NH₃ gas and H₂ gas as reduction gases; and
    annealing the substrate to cause the Ni film on the surface of the substrate and on a side surface of the recess to reflow into the recess to partially fill the recess;
    forming another Ni film on the surface of the substrate by CVD or ALD by using the Ni compound and NH₃ gas and H₂ gas; and
    annealing the substrate to cause the other Ni film on the surface of the substrate and on the side surface of the recess to reflow into the recess to completely fill the recess, and
    wherein a NH₃/H₂ ratio representing a flow rate ratio of NH₃ gas to H₂ gas serving as the reduction gases for forming the other Ni film is smaller than a NH₃/H₂ ratio for forming the Ni film.

2. The method of claim 1, wherein the substrate includes a base and an underlying film formed on the base, and the recess is formed on the underlying film.

3. The method of claim 2, wherein the base is made of a semiconductor, and the underlying film is an interlayer insulating film formed on a predetermined underlying structure of the base, and the recess is a trench.

4. The method of claim 1, wherein a NH₃/H₂ ratio to form the Ni film is within a range from 0.25 to 4.

5. The method of claim 4, wherein the NH₃/H₂ ratio for forming the Ni film is within a range from 0.67 to 4.

6. The method of claim 5, wherein the NH₃/H₂ ratio for forming the Ni film is within a range from 0.67 to 2.33.

7. The method of claim 1, wherein the Ni compound serving as the film forming material in said forming the Ni film contains nickel amidinate.

8. The method of claim 1, wherein said annealing is performed at a temperature ranging from 200° C. to 600° C.

9. The method of claim 1, wherein further comprising forming additional layers of the Ni film and annealing the additional layers in a repeated manner.

10. The method of claim 1, wherein the substrate has an additional recess having a small width or diameter than the recess, and
wherein the additional recess is completely filled by forming the Ni film and annealing the Ni film.

11. The method of claim 1, wherein a film of the Ni film is smaller than a film thickness in the other Ni film.

12. The method claim 1, further comprising:
after said annealing, polishing an entire surface of the substrate and removing films on the entire surface other than the Ni film and the other Ni film filled in the recess.

13. The method of claim 1, wherein before said forming the Ni film, the substrate having the recess is etched-back to etch protruding portions formed at the recess to increase the width of the recess, and
wherein the Ni film is formed on a barrier film of the substrate and the barrier film is made of one selected from the group consisting of Ti, TiN, Ta and TaN.

14. A non-transitory computer-readable storage medium storing a program for controlling an Ni wiring manufacturing system, wherein the program, when executed by a processor, causes the Ni wiring manufacturing system to performs a method of Ni wiring manufacturing, wherein the method comprises:
forming a Ni film on a surface of a substrate having a recess formed thereon by CVD or ALD by using a Ni compound as a film forming material and $NH_3$ gas and $H_2$ gas as reduction gases;
annealing the substrate to cause the Ni film on the surface of the substrate and on a side surface of the recess to reflow into the recess to partially fill the recess;
forming another Ni film on the surface of the substrate by CVD or ALD by using the Ni compound and $NH_3$ gas and $H_2$ gas; and
annealing the substrate to cause the other Ni film on the surface of the substrate and on the side surface of the recess to reflow into the recess to completely fill the recess,
wherein a $NH_3/H_2$ ratio representing a flow rate ratio of $NH_3$ gas to $H_2$ gas serving as the reduction gases for forming the other Ni film is smaller than a $NH_3/H_2$ ratio for forming the Ni film.

15. The method of claim 13, wherein the Ni film is formed directly on a barrier film.

* * * * *